United States Patent [19]

Crane

[11] Patent Number: 5,757,599
[45] Date of Patent: May 26, 1998

[54] PROTECTION ARRANGEMENT FOR A SWITCHING DEVICE

[75] Inventor: Allan D. Crane, Rugby, United Kingdom

[73] Assignee: Cegelec Controls Limited, Warwickshire, United Kingdom

[21] Appl. No.: 777,020

[22] Filed: Dec. 30, 1996

[30] Foreign Application Priority Data

Jan. 16, 1996 [GB] United Kingdom ............. 9600808

[51] Int. Cl.$^6$ ........................................ H02H 9/00
[52] U.S. Cl. ................ 361/56; 307/130; 323/284; 363/58
[58] Field of Search ................ 361/56, 88, 91; 307/116, 130; 323/274–277, 284–285; 363/50, 55–58; 257/121

[56] References Cited

U.S. PATENT DOCUMENTS

4,825,272 4/1989 Lehmann ............... 257/121

*Primary Examiner*—Jeffrey A. Gaffin
*Assistant Examiner*—Michael J. Sherry
*Attorney, Agent, or Firm*—Kirschstein, et al.

[57] ABSTRACT

To protect a switching device having a possible open-circuit failure condition, an arrangement is featured in which a thyristor is connected in parallel with the main current-carrying terminals of the switching device to be protected. The thyristor is connected so that the forward current direction of the thyristor is the same as the normal current direction through the main terminals of the switching device. The arrangement provides for the thyristor to present an irreversible effective short-circuit when its normal parameter ratings are exceeded. The protection arrangement is particularly suitable for insulated-gate bipolar transistors (IGBT's) and preferably employs a pressure-packaged asymmetrical thyristor (ASCR) as the protection thyristor. The ASCR should be selected to withstand the normal (snubber-limited) dV/dt of the voltage across the switching device.

16 Claims, 6 Drawing Sheets

PROTECTION ARRANGEMENT FOR A SWITCHING DEVICE

BACKGROUND OF THE INVENTION

The invention concerns a protection arrangement for a switching device and especially, but not exclusively, a protection arrangement for an insulated-gate bipolar transistor (IGBT).

Semiconductor switches are commonly used to interface high-voltage DC supplies to loads such as induction or synchronous motors. A typical arrangement is the bridge configuration illustrated in FIG. 1. In this configuration, each arm 10, 20, 30, 40 of the bridge comprises a semiconductor switch arrangement 11, 21, 31, 41 connected in series with a saturable inductance 12, 22, 32, 42 which is in turn coupled to one of two high-voltage DC power rails, 51, 52. A capacitor 53 is connected between the DC rails 51, 52, the connections to the capacitor constituting a source of stray inductance 54. Connected in parallel with each inductance 12, 22, 32, 42 is a number of diodes 13-1 . . . 13-n, 23-1 . . . 23n, 33-1 . . . 33-n, 43-1 . . . 43-n connected in series. Each diode is conventionally shunted by a metal-oxide varistor 14-1 . . . 14n, 24-1 . . . 24-n, 34-1 . . . 34-n, 44-1 . . . 44-n to provide protection for the diode. Connected between arms 10, 20 and 30, 40 is a load 55.

Figure 1:
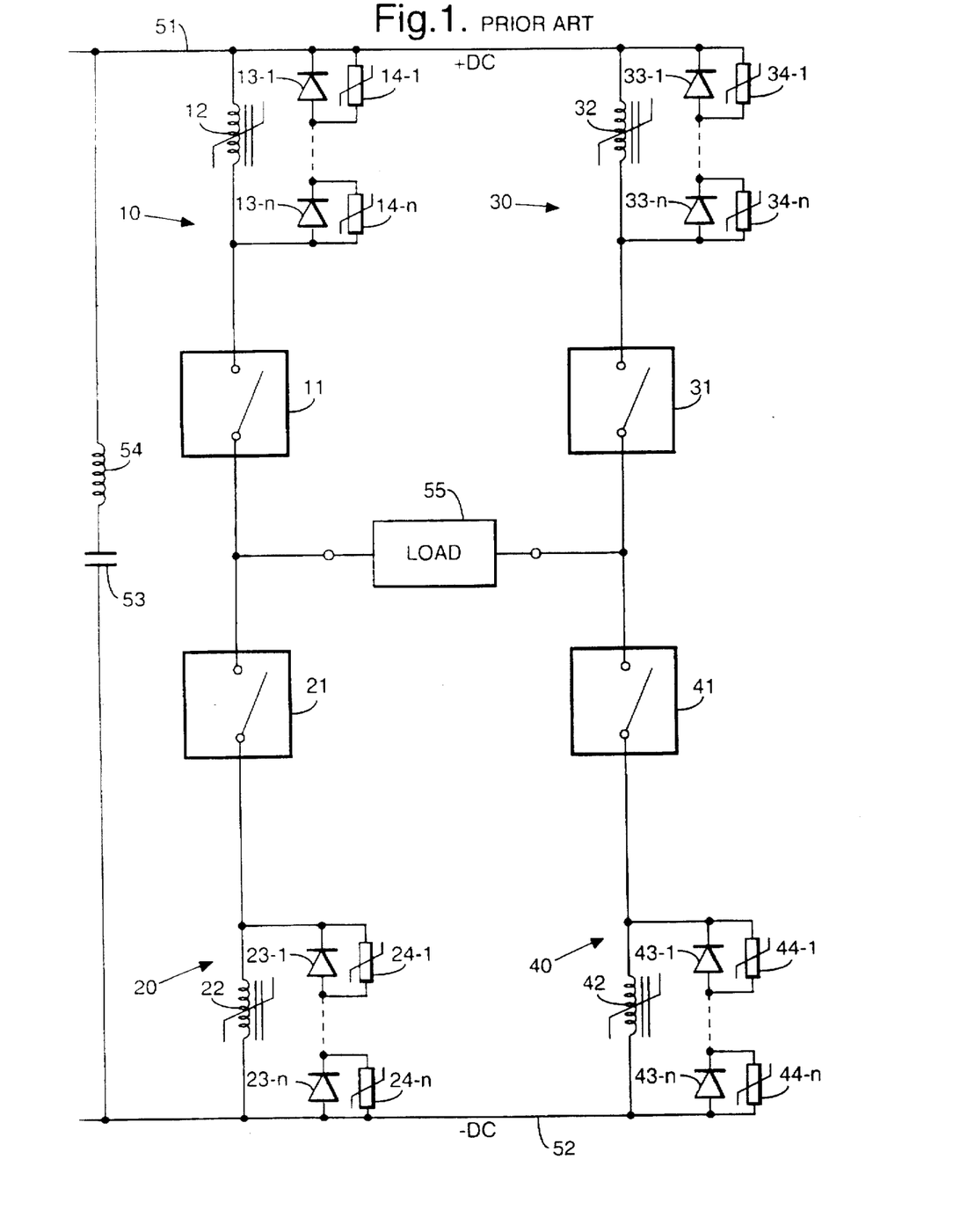
FIG. 1 is a schematic diagram of a known bridge circuit employing a number of semiconductor switching arrangements.

Switch arrangements 11, 21, 31, 41 are switched in an appropriate sequence to provide an AC drive to the load 55. The purpose of the inductances 12, 22, 32, 42 is to limit the rate of rise of switching current (dI/dt) through the switch arrangements to a safe level for the devices used, and also, where each switch arrangement comprises a number of switches in series, to support arm voltage within the period after the first switch turns on and before the last switch turns on, so that the full arm voltage is not applied to the last switch. The diodes 13-1 . . . 13-n, etc. allow reactive current to flow through the switch arrangements and in this respect come into play only momentarily when current through the respective arm reverses direction. Under steady-state conditions, however, arm current flows preferentially through the associated inductances 12, 22, 32, 42. The switch arrangements normally each comprise a series arrangement of semiconductor switching devices, which may be, for example, thyristors (SCR's), gate-turn-off thryristors (GTO's), insulated-gate bipolar transistors (IGBT's) or MOS-controlled thyristors (MCT's). Each link in the series chain may consist of a number of switching devices connected in parallel in order to increase the available drive current to the load. A series arrangement of switching devices is necessary, since the individual devices used are only designed to withstand a certain OFF-state voltage before they break down, and the DC voltage rails used in such bridge circuits may be many times greater than this breakdown voltage. In view of the susceptibility of such devices to overvoltage breakdown, measures are normally taken to ensure that no one switching transistor or thyristor is subject to more than its maximum rated OFF-state voltage. This is important because many switching devices that are used, e.g IGBT's, virtually explode when they fail, scattering metallic fragments onto neighbouring circuitry. Furthermore, such devices tend to be expensive to replace. Additional measures are taken to ensure that the rate of increase of this voltage (dV/dt) is kept to below a certain level and to ensure that the reverse voltage across the switching devices does not exceed a certain level. In the first of these additional measures, a snubber arrangement is included connected in parallel with the switching device, and in the second, an anti-parallel diode is also connected in parallel with each switching device.

A polarised snubber, in which the snubber capacitor is connected in series with a diode, is often required to be used, but this can lead to overshoot of the switching-device voltage above the DC power rail at switch-off. The diodes shown in FIG. 1 are helpful in this regard, since they can serve to clamp this overshoot voltage; however, the effectiveness of this clamping action is limited by the presence of the stray inductance 54, the result being that the switching devices can still be subjected to damaging overvoltages.

Other risk areas in the protection measures mentioned earlier are the possibility that the snubber may fail, thereby removing the control on dV/dt across the switching device, also that the anti-parallel diode may fail (e.g. its wire bonds may fuse), resulting in the exposure of the switching device to damaging reverse voltages. Another possible source of switching-device failure is failure of one of the series-connected switching devices constituting the switch arrangements 11, 21, 31, 41 to turn on, which may be due to problems in the drive circuitry feeding that switching device, or to problems in the "ON-command" signal feed to the device. If the other devices in the chain succeed in turning on, the device which has not responded will be subjected to a fatal overvoltage. A further source of trouble, where a number of parallel-connected switching devices are employed in each link in the chain, is the rupture of one of these devices. Again, such rupture may be due to fusing of the wire bonds feeding the device. Such rupture can result in an increase in the saturation voltage of the chain link, leading in turn to possible failure of the other working devices due to excessive power dissipation. Clearly, this is particularly hazardous if more than one device in the link ruptures.

SUMMARY OF THE INVENTION

In accordance with a first aspect of the invention, there is provided a switching arrangement comprising a switching device protected by a thyristor, the thyristor and the switching device being connected in parallel by their main current-carrying terminals such that a forward current direction of the thyristor is the same as a direction of a current which passes between said main current-carrying terminals during normal operation of the switching device, the protection arrangement being such that the thyristor fails when voltage conditions across the switching device become potentially damaging to said switching device and presents an irreversible low impedance across said switching device.

Whereas in conventional protection arrangements a thyristor providing the protection provides a low impedance to clamp the operating voltages of the device to be protected to a safe level, but does so without itself failing irreversibly, in the present protection arrangement the thyristor is deliberately made to fail and provide an irretrievable low impedance (i.e. effectively a short-circuit). An advantage of this is that, where the switching devices being protected form part of a series chain of such devices, the remaining switching devices in the chain can be allowed to continue functioning normally for any required length of time while the devices that have been saved from a dangerous operating condition are being safely shunted by the the failed SCR. There is, in this arrangement, no risk that the protection will accidentally be removed. Indeed, the logic circuitry or logic power connected with these switching devices can happily fail without this making any difference to the operation of the thyristor protection arrangement. This could hardly be said of more conventional arrangements in which the device which is carrying out the protecting function is merely temporarily placed in a shunting mode and requires the continued fault-free operation of associated drive circuitry to maintain the shunting effect.

This advantage is also apparent where, say, an arm of a bridge circuit containing the shorted thyristor is temporarily taken out of service (all power to it is cut off) and then reconnected (power restored), in a situation in which the fault which caused the shorting in the first place still existed. With the protection arrangement of the present invention, the link containing the short-circuited thyristor would, on reconnection, still appear as a short-circuit, the previous removal of power having made no difference to this condition. There would be therefore no risk that the thyristor would not crowbar and provide that protection the second time around.

The thyristor may be a pressure-packaged thyristor. One advantage of this is that the low-impedance state of the thyristor on failure of the latter is made very low so as to ensure both that the voltage across the switching device is kept to a safe low level and that the power dissipation of the failed thyristor following failure is not excessive. A further advantage is that any material released from the thyristor pellet during a failure event is contained within the packaging, thereby removing the risk of damage to neighbouring circuitry. Although pressure-packaging is not the only way of achieving the above benefits (for example, the pellet may be metallised on both sides and large-area soldered connections made, giving a degree of mechanical support, but without all the features of compression packaging), it is the preferred method in view of its superior performance.

The thyristor may also be an asymmetrical thyristor. This type of thyristor has several advantages, among them speed of switching and a very low reverse-breakdown voltage.

A snubber means may be connected in parallel with the switching device, the assymetrical thyristor being selected to be able to withstand the normal rate of change of voltage across the switching device in the presence of a functioning snubber means.

A clipper means may be connected in parallel with the asymmetrical thyristor. The clipper means may comprise an overvoltage-sensing means for sensing the presence of an overvoltage condition across the switching device and providing a corresponding overvoltage control signal at an overvoltage control output, and a thyristor-triggering means connected to the overvoltage control output, the thyristor-triggering means serving to trigger the thyristor into conduction during said overvoltage condition.

The protection arrangement may comprise a switching-device switching means connected between the overvoltage control output of the clipper means and a control terminal of the switching device, the connections between the overvoltage control output and the thyristor-triggering means and between the overvoltage control output and the switching-device switching means being such as to prevent triggering of the thyristor when the switching device receives its normal turn-on signal during normal operation, and being such as to ensure that, under said overvoltage condition of the switching device, the switching device turns on in preference to the thyristor.

An advantage of this measure is that it allows the switching device to be turned on by an alternative route as a first level of overvoltage protection, rather than the thyristor, in situations where such alternative turn-on of the switching device is still possible. Where a fault exists such that this alternative switching is not feasible, the thyristor is turned on instead as a second level of overvoltage protection.

The overvoltage-sensing means may comprise an avalanche diode and a resistance connected in series across the switching device, the overvoltage control output being constituted by the junction of the avalanche diode and the resistance, and the thyristor-triggering means may comprise a zener diode connected in series with a diode between the overvoltage control output and the gate of the thyristor, the breakdown voltage of the zener diode being greater than a voltage threshold beyond which the switching-device is driven to an ON-state.

The switching device may be an insulated-gate bipolar transistor. This device has the advantage that it can be driven at high frequency and has low switching losses.

In accordance with a second aspect of the invention, there is provided a switching module for the connection of a load to a power source, comprising a switching device and a protection arrangement as described above.

The thyristor of the protection arrangement may be disposed with respect to its associated circuitry such that it can be easily changed when it has failed. It is a major advantage of the present invention that the thyristor used to perform the protection function can be a standard, fairly low-grade device which is cheap to replace when it has entered its failure mode. In this respect, the thyristor acts as a kind of fuse, albeit a fuse which "fuses" to a short-circuit rather than an open-circuit state, and as such is advantageously placed in an easily accessible location where it can be readily replaced.

In accordance with a third aspect of the invention, there is provided a high-voltage bridge arrangement for the connection of a load to a power source, in which each arm of the bridge comprises a plurality of series-connected switching modules, each as described above.

In accordance with a fourth aspect of the invention, there is provided a method for the protection of a switching device against a damaging forward overvoltage. The switching device has main current-carrying terminals which are connected in parallel with a thyristor such that a forward current direction of the thyristor is the same as a direction of a current which passes between said main current-carrying terminals during normal operation of the switching device. The method includes the steps of:

(a) the presence of an overvoltage across the main current-carrying terminals of the switching device is sensed;

(b) an overvoltage control signal is formed from step (a);

(c) the switching device is attempted to be switched into its ON-state by means of the overvoltage control signal;

(d) where the attempt in step (c) fails, the thyristor is triggered into its forward conductive state by means of the overvoltage control signal, and (e) the thyristor is allowed to fail and to enter an irreversible low-impedance state. The voltage across the switching device is being thereby clamped to a safe low level.

In accordance with a fifth aspect of the invention, there is provided a method for the protection of a switching device against a damaging reverse overvoltage. The switching device has main current-carrying terminals which are connected in parallel with a thyristor such that a forward current direction of the thyristor is the same as a direction of current which passes between said main current-carrying terminals during normal operation of the switching device. The method includes the steps of:

(a) in the presence of a level of reverse voltage which is greater than the rated reverse breakdown voltage of the thyristor but less than that of the switching device, the thyristor is allowed to enter its reverse breakdown mode, and (b) the thyristor is allowed to fail and to enter an irreversible low-impedance state due to the reverse breakdown mode. The reverse voltage across the switching device is thereby clamped to a safe low level.

Step (a) in this case may follow the failure of an antiparallel diode connected across the switching device to limit the reverse voltage across the switching device.

In accordance with a sixth aspect of the invention, there is provided a method for the protection of a switching device against a damaging rate of voltage increase (dV/dt). The switching device has main current-carrying terminals which are connected in parallel with a thyristor such that a forward current direction of the thyristor is the same as a direction of a current which passes between said main current-carrying terminals during normal operation of the switching device. The method including the steps of:

(a) in the presence of a rate of voltage increase which is greater than the dV/dt turn-on rating of the thyristor but less than that which would damage the switching device, the thyristor is allowed to turn on due to excessive dV/dt;

(b) allowing the thyristor to experience a damaging rate of current increase or damaging thermal overload, and (c) the thyristor is allowed to fail and to enter an irreversible low-impedance state due to the damaging rate of current increase or thermal overload, the voltage across the switching device being thereby clamped to a safe low level.

Step (a) may follow the failure of a snubber arrangement connected across the switching device to limit the rate of voltage increase across the switching device.

As well as the various steps described above, there may be the additional steps of removing the cause of the overvoltage condition or of the excessive rate-of-voltage-increase condition and replacing the failed thyristor with a non-failed thyristor, thereby restoring the switching device and protection arrangement to their normal operating condition and standby condition, respectively.

The thyristor may be a pressure-packaged asymmetrical thyristor.

BRIEF DESCRIPTION OF THE DRAWINGS

An embodiment of the invention will now be described, by way of example only, with reference to the drawings, of which.

DETAILED DESCRIPTION OF EMBODIMENTS OF THE INVENTION

Figure 2:
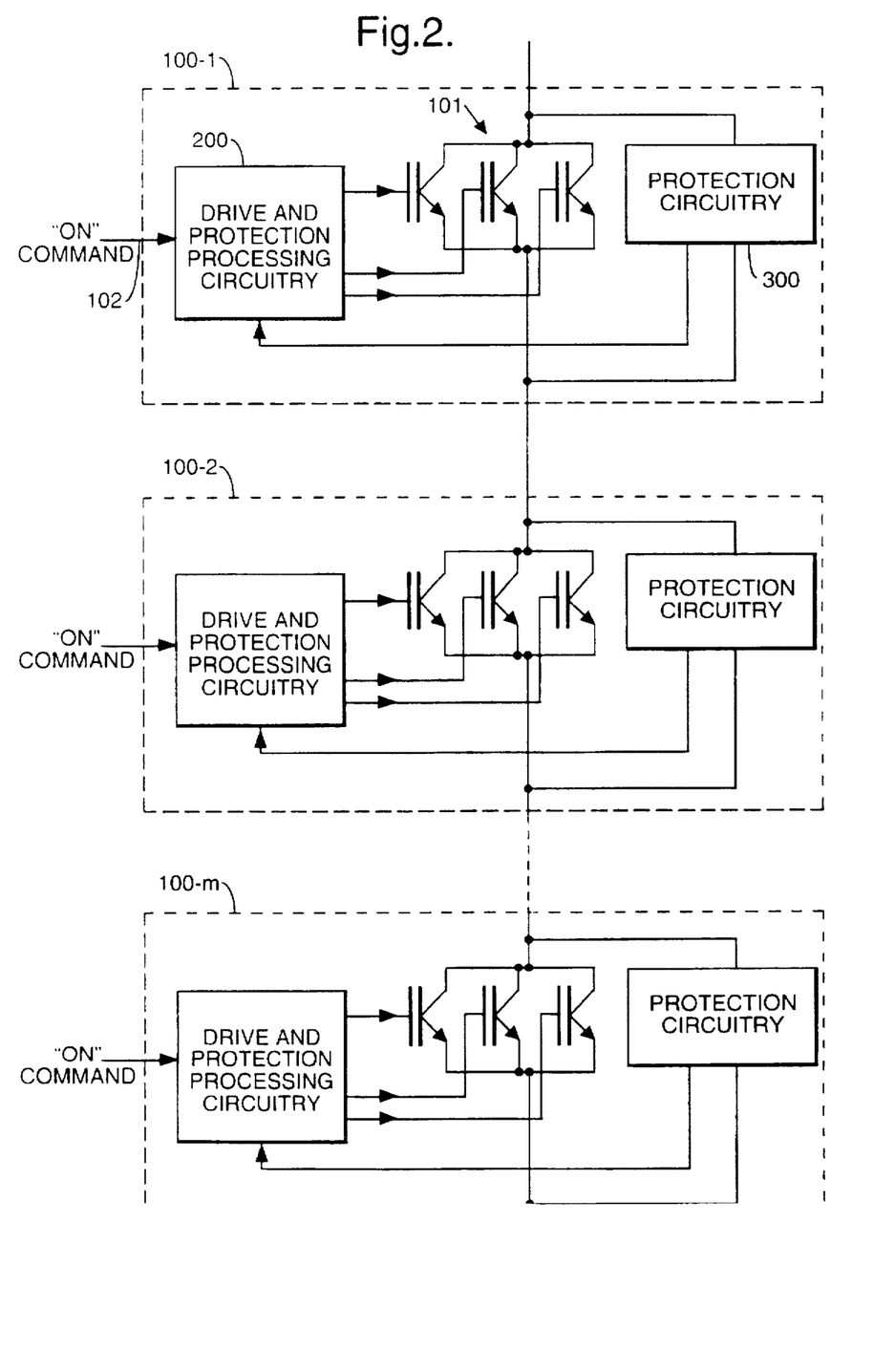
FIG. 2 is a schematic diagram showing a number of switching modules making up one of the switching arrangements shown in FIG. 1.

Referring first to FIGS. 1 and 2, each switch 11, 21, 31, 41 shown in FIG. 1 consists of a series chain of switching modules 100-1, 100-2 ... 100-m. Each module is identical and comprises a number of parallel-connected insulated-gate bipolar transistors (IGBT's) 101. Three of these are shown, although in practice there may be significantly more than this, e.g. ten. These are driven in parallel via a drive and protection processing block 200 (described later) nominally only upon the appearance of an "ON" command signal 102 (and, of course, corresponding "OFF" command signals on the same input) applied to the drive circuitry of the drive and protection processing block 200. Connected in parallel with the IGBT's is a protection block 300 (likewise described later). The IGBT's 101 in the series chain 100-1 ... 100-m share the OFF-state voltage appearing across that chain. This voltage may, in a typical application, be around 8 kV and the number of modules in the chain may be five, resulting in 1600V across each module (assuming equal sharing) in the OFF-state.

IGBT's are used in preference to other devices because they have low switching losses. This allows them to be used either at low switching frequencies with very low energy losses, or at high switching frequencies (e.g. 2 kHz) with somewhat higher levels of energy loss comparable with the kind of loss expected from other devices.

Figure 3A:
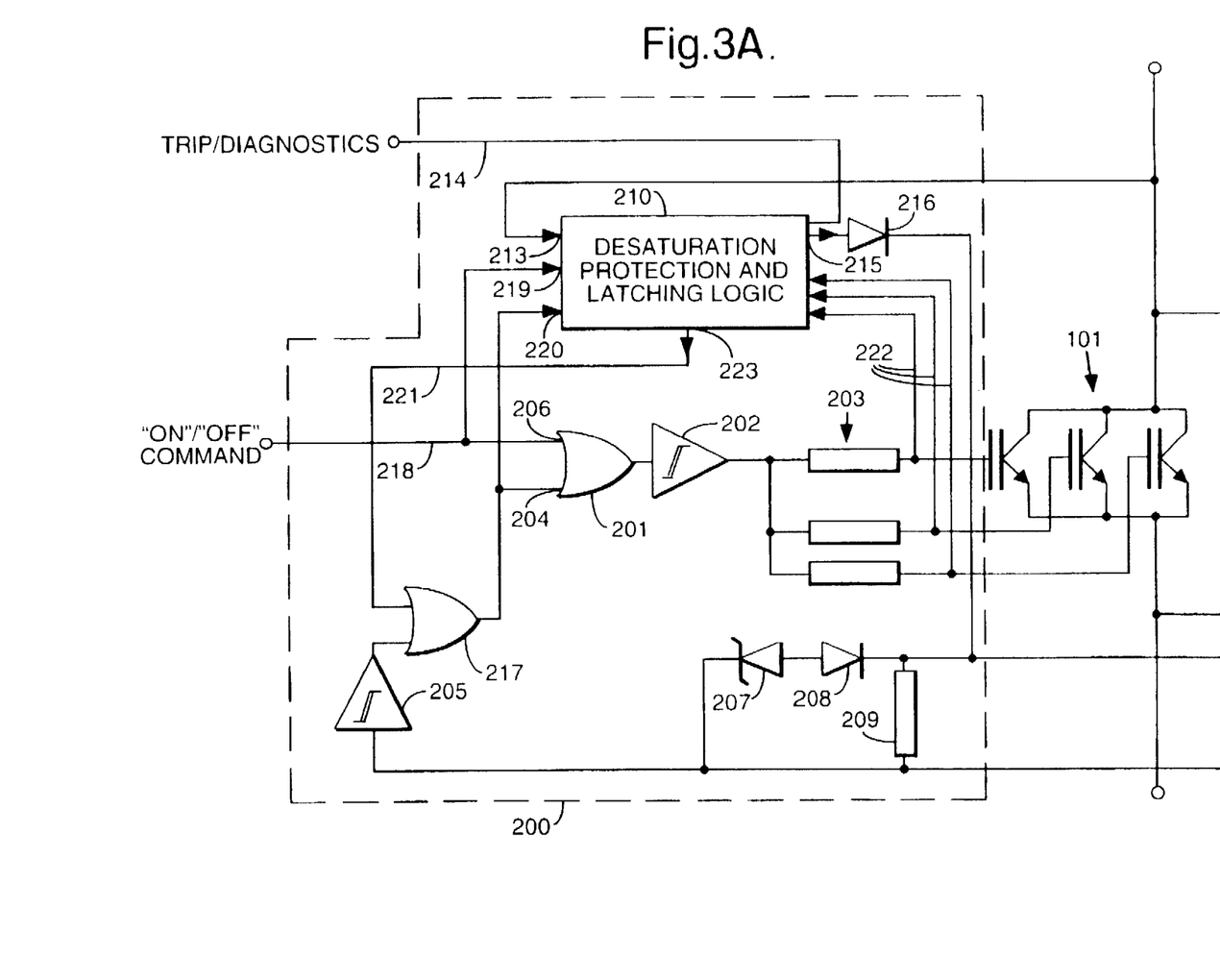
FIG. 3 is a circuit diagram of one of the switching modules shown in FIG. 2.
Figure 3B:
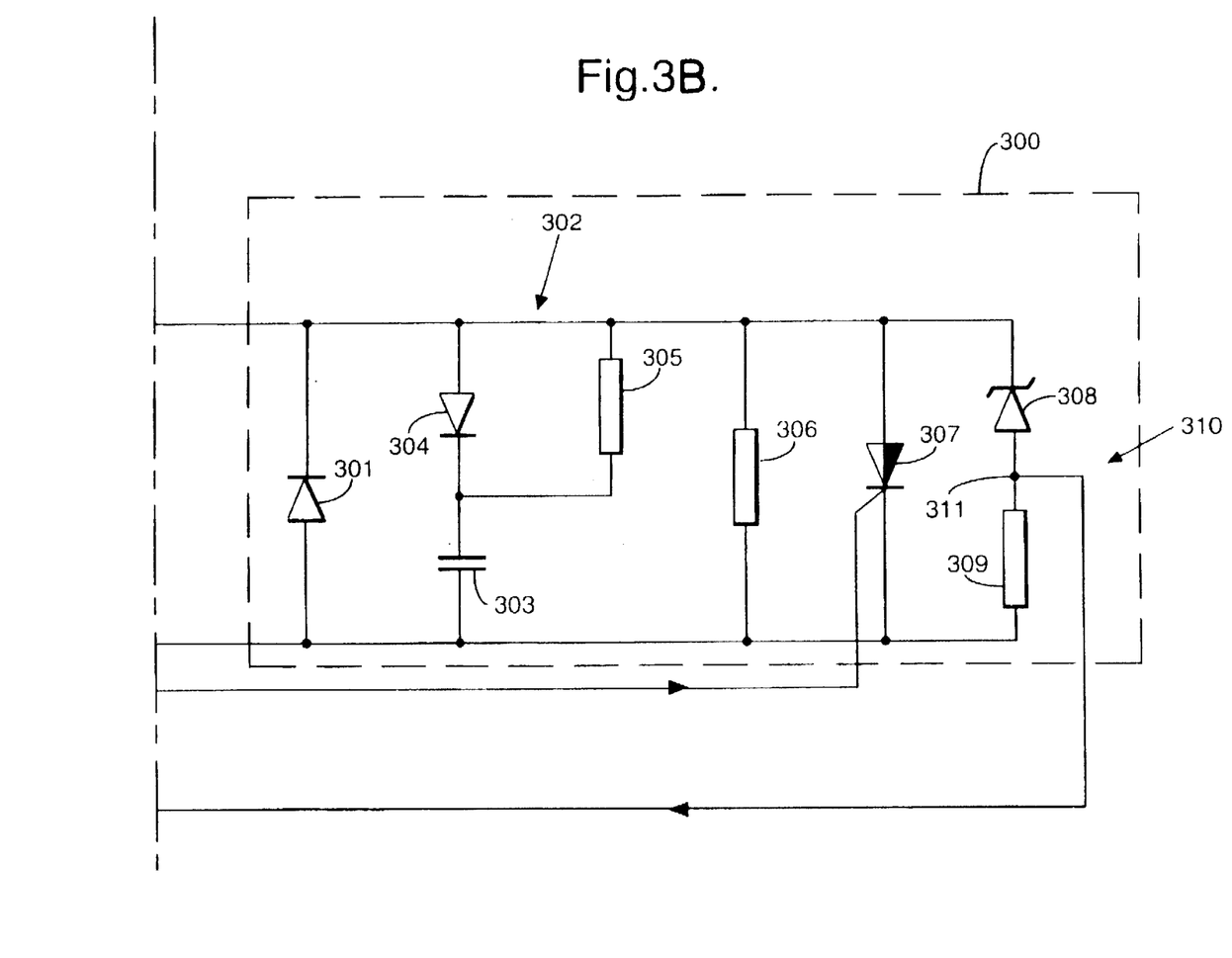

Referring now to FIG. 3, the protection block 300 and the drive and protection processing block 200 are shown in greater detail.

The protection block 300 comprises a number of components or groups of components connected in shunt with each other across the IGBT's 101. These components include an anti-parallel diode 301; a polarised snubber 302 consisting of a capacitor 303 connected in series with a parallel-connected diode 304 and resistor 305; a sharing resistor 306; an asymmetrical thyristor (ASCR) 307 and a clipper arrangement 310 consisting of a zener or avalanche diode 308 in series with a resistor 309.

The anti-parallel diode 301 is a well-known measure in itself and serves to clamp any reverse voltage appearing across the IGBT's to a low level, namely the forward-biased voltage of the diode itself. The polarised snubber, also known in the art, allows fill snubbing action from the capacitor 303 via the diode 304 when the IGBT's are switched off, but also protects the IGBT's from excessive snubber-discharge currents during turn-on of the IGBT's by virtue of the inclusion of resistor 305 as a discharge path. The sharing resistor 306 is of such a value as to allow a quiescent current to pass through all the resistors 306 in the chain which dominates the leakage current of the IGBT's in each module. This ensures equal sharing of the OFF-state voltage by each module in the chain, assuming this resistor has the same value in all modules. The function of the clipper arrangement 310 will be explained later.

Figure 4A:
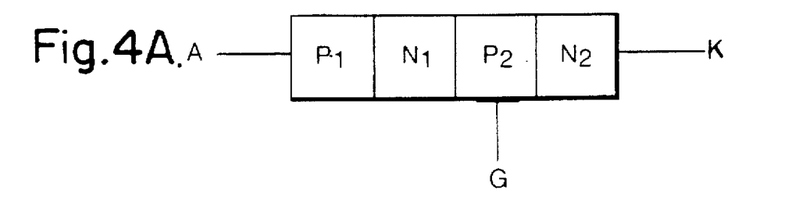
FIG. 4 is a schematic diagram showing the constitution of two types of asymmetrical thyristor in comparison with that of a conventional type of thyristor.
Figure 4B:
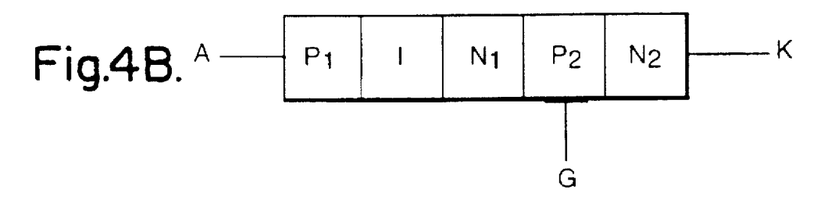
Figure 4C:
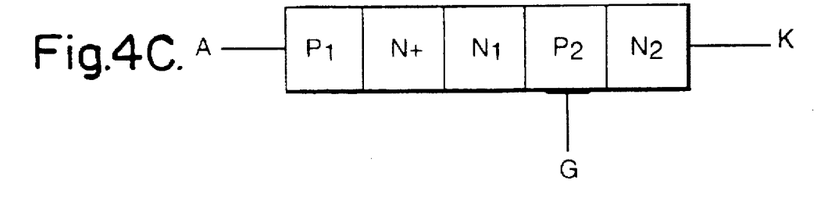

An ASCR is employed as the protection device in the preferred embodiment of the invention since it lends itself particularly well to the protection functions envisaged by the invention, especially where these are applied to the protection of IGBT switching devices. The constitutions of two types of ASCR are shown schematically in FIGS. 4(b) and 4(c). A conventional "symmetrical" thyristor is shown in FIG. 4(a). The conventional device consists of four layers, $P_1$, $N_1$, $P_2$, $N_2$ with the three terminals (anode, cathode and gate) of the device connected as shown to the various layers. In the asymmetrical thyristor there is an extra layer, namely an "intrinsic" (I) layer in the version shown in FIG. 4(b), or an N+layer in the version shown in FIG. 4(c). Due to the presence of the extra layer and the opportunity this gives to optimise the device for switching performance, the ASCR possesses certain characteristics relative to the conventional SCR which are desirable in the present application. These are:

(1) A higher dV/dt rating. This enables these devices to be used to protect IGBT's, which tend to be operated at higher frequencies than other switching devices.

(2) A low reverse-voltage rating. This enables the ASCR to be used to protect switching devices which themselves have low reverse-breakdown ratings.

(3) Speed. The ASCR can offer very reliable protection without the fear that the switching device to be protected will have reached dangerous operating conditions before the SCR has turned on.

The ASCR is selected to be able to withstand the normal snubber-limited dV/dt of the voltage across the IGBT's without turning on and to ensure that it will not turn on spuriously while the IGBT's are turned off. A further point to note about the ASCR is that it is also pressure-packaged, for an explanation of which see later.

The drive and protection processing block 200 (see FIG. 3) comprises a two-input OR-gate 201 connected at its output to a Schmitt trigger 202, the output of the Schmitt trigger 202 feeding the gates of the three IGBT's 101 by way of respective drive resistors 203. One input 204 of the OR-gate 201 is fed from the output of another two-input OR-gate 217, one input of which is connected to the output of a second Schmitt trigger 205 and the second input of which is connected to an output 223 of a desaturation protection and latching logic block 210 on a feedback line 221. The input of the Schmitt trigger 205 is connected to the node 311 joining the zener (or avalanche) diode 308 and the resistor 309 which together form the clipper 310. A second input 206 of the OR-gate 201 is supplied with an "ON"/ "OFF" command signal on an input line 218 by way of an optical-fibre link (not shown). The node 311 of the clipper 310 is also connected to the gate of the ASCR 307 by way of a zener diode 207 and a diode 208 connected in series. A resistor 209 is connected directly between the node 311 and the gate of the ASCR 307. This resistor serves to define the current flowing in the gate of the ASCR.

The desaturation protection and latching logic block 210 receives signals from the IGBT's 101 and from various parts of the protection processing block 200 and acts, among other things, to protect the remaining IGBT's from excessive power dissipation where one, or possibly more of them, has gone open-circuit for some reason. It is described in more detail later.

The operation of the protection arrangement of the invention will now be described.

The clipper 310 acts as a first level of overvoltage protection for the IGBT's 101 and provides a clamping action for overvoltages which are comfortably below a level which would be considered dangerous for the IGBT's and which are of only short duration. The device chosen for this function should have the following characteristics: a low dynamic slope resistance above its breakdown voltage, so that its clamping effect vis-à-vis the IGBT's is not impaired; a low leakage current below its breakdown voltage, so that prior to breakdown insufficient current passes through the sensing resistor 309 to trigger various protection circuitry to be described; and a low temperature coefficient of clipping voltage. A latching-type breakover diode is not appropriate for this application.

For conditions of higher overvoltage (and/or overvoltage of greater duration) one of a number of further protection levels comes into action, as will now be explained. Assume as one possible potential failure mode that the gates of the IGBT's 101 in one particular module do not receive an "ON" signal that is applied to the chain, e.g. because of non-integrity of the optical link supplying this signal to the block 200, but that the circuitry inside the block 200 is fully operational and that the snubber 302 is likewise functional. Clearly, should the remaining modules in the chain switch on, as they are supposed to do, this would place the IGBT's in the module that has not turned on into a damaging overvoltage condition, namely the appearance of the fill arm voltage across that module. Under these conditions, the voltage across the unswitched IGBT's starts to rise, but at a rate which is controlled by the snubber 302 so that the ASCR 307 does not turn on by dV/dt action. When this voltage exceeds the zener voltage of the zener diode 308, resistor 309 starts to pass current. This occurs progressively over a portion of the ON-cycle. At some point, since this condition is not merely a transient one which can be effectively clamped by the clipper 310 alone, the voltage across resistor 309 will exceed the triggering threshold of the Schmitt stage 205 and will cause a turn-on signal to be applied to the gates of the IGBT's by way of the OR-gates 217 and 201 and the Schmitt stage 202. (Note that this threshold is lower than that which would turn on the ASCR 307). The result of this is that the IGBT's in that module turn on before the developing overvoltage has reached a level which would destroy these devices.

The turn-on signal at the output of the OR-gate 217 is latched by a latching signal entering the gate 217 on the feedback line 221. This latching signal is derived from logic within the desaturation protection and latching logic block 210, as shown in FIG. 5.

Figure 5:
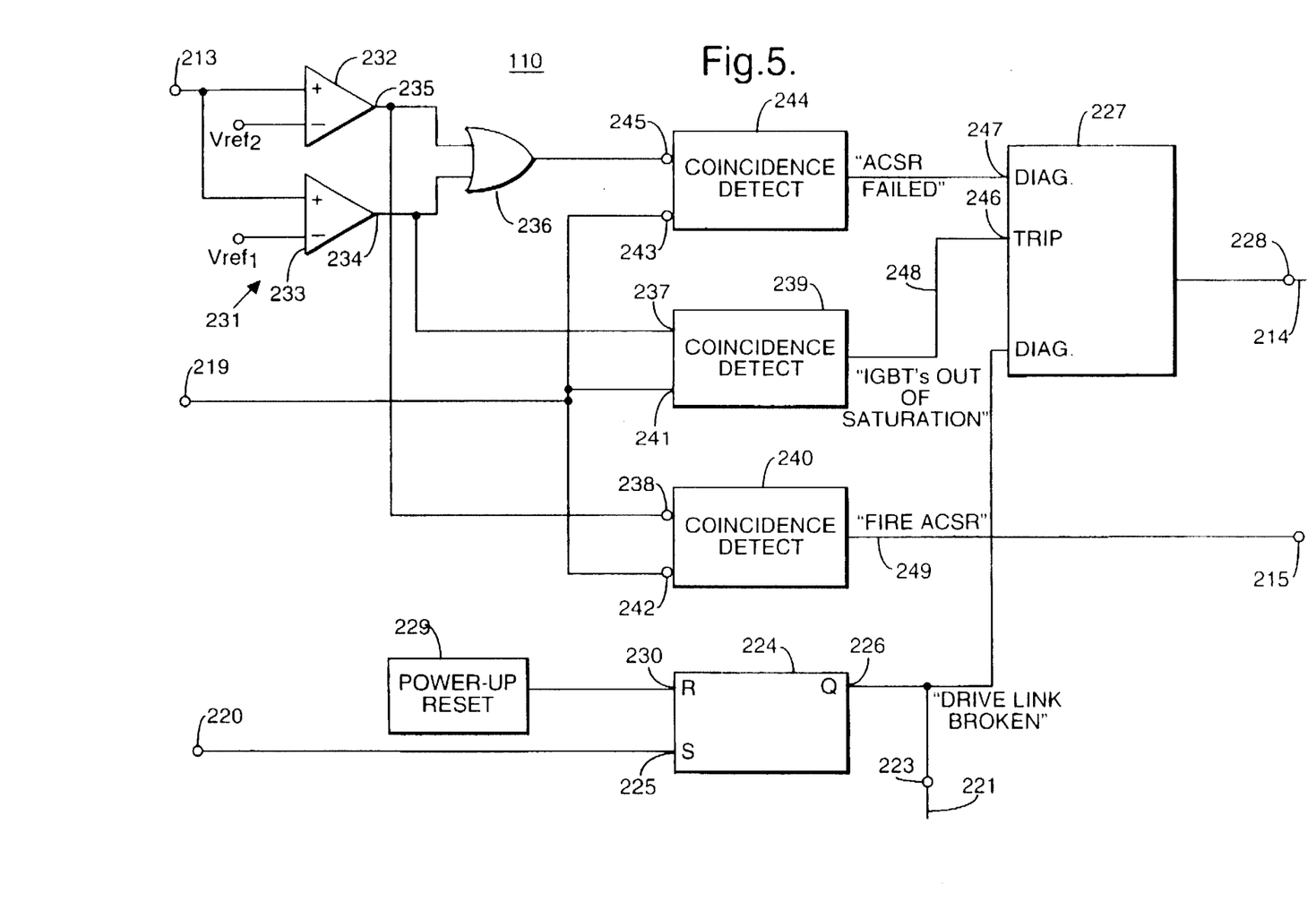
FIG. 5 is a schematic diagram of the desaturation protection and latching logic block of FIG. 3.

In FIG. 5, which shows in purely schematic form details of part of the desaturation protection and latching block 210, an R-S latch 224 receives on its "set" input 225 the turn-on signal at an input 220 of the logic block 210. The appearance of this signal sends the Q-output 226 of the latch 224 high, which in turn latches the OR-gate 217 by way of output 223 of the logic block 210 and the feedback line 221. At the same time, the high signal at the Q-output of the latch 224 is encoded in a "trip/diagnostic encode" block 227 to provide an appropriate "diagnostics" signal at an output 228 of the logic block 210. This diagnostics signal is output along a line 214 to a fibre-optic link (not shown) in such an encoded form as to provide a signal informing service personnel that the IGBT's have turned on as a result of a failure in the normal drive link to the module concerned.

This protection mode protects the unswitched IGBT's from failure by tuning them on via a different route. It acts as a second level of overvoltage protection and is a reversible condition, since the latched clamping action of the IGBT's in that module can be removed simply by disconnecting the module from its logic power supply. Reconnection following correction of the "ON"/"OFF" command optical link fault results in a normal unlatched OFF-state drive to the IGBT's in question. This is ensured by the provision of a "power-up reset" facility 229 which drives the "reset" input 230 of the latch 224. The power-up reset block 229 may take the form of a conventional resistor-capacitor network (not shown) connected between the logic power supply and logic ground, the junction between the resistor and capacitor being taken to the input 230 of the R-S latch 224.

In a second possible failure mode, there is also a break in the drive signal path to the IGBT gates in one module in the chain, but this time due to a fault in the electronics in the block 200 or in the logic power feed to that block. Under these circumstances, the protection action described above cannot occur, since the IGBT's cannot turn on. Again, assuming the snubber 302 to be functional, the ASCR 307 does not turn on by dV/dt action, but the voltage across resistor 309 rises progressively once the zener voltage of the zener diode 308 has been reached and tries to turn on the IGBT's by way of the OR-gate 201 and associated components. This is impossible because of the afore-mentioned problems in the drive circuitry and the next step is that the rising voltage on node 311 of the clipper 310 reaches the switching threshold of the ASCR gate, this threshold being arranged to be greater than that of the Schmitt stage 205 by suitable choice of zener voltage of the zener diode 207. The ASCR 307 starts to switch on and the resulting sharp rise in current through the ASCR causes this device to fail. This may be termed a third level of overvoltage protection.

Helping to secure failure of the ASCR in this process are two factors: firstly, the thyristor used is one whose dI/dt-withstand capability has not been optimised in the normal sense for such a turn-on condition so that the device will, in all probability, fail due to excessive dI/dt of the load current passing through it. Secondly, the thyristor is not heatsunk, or is at best only lightly heatsunk, so that the continued passing of the load current through the device will lead to excessive dissipation in the device, this then ensuring ASCR failure where failure due to excessive dI/dt has not previously taken place.

Since the device has failed irreversibly, a sustained driving of the thyristor gate into conduction is not necessary, in contrast with more conventional crowbar designs.

As mentioned earlier, the ASCR is a pressure-packaged device. The significance of this is explained now with reference to FIG. 6.

Figure 6:
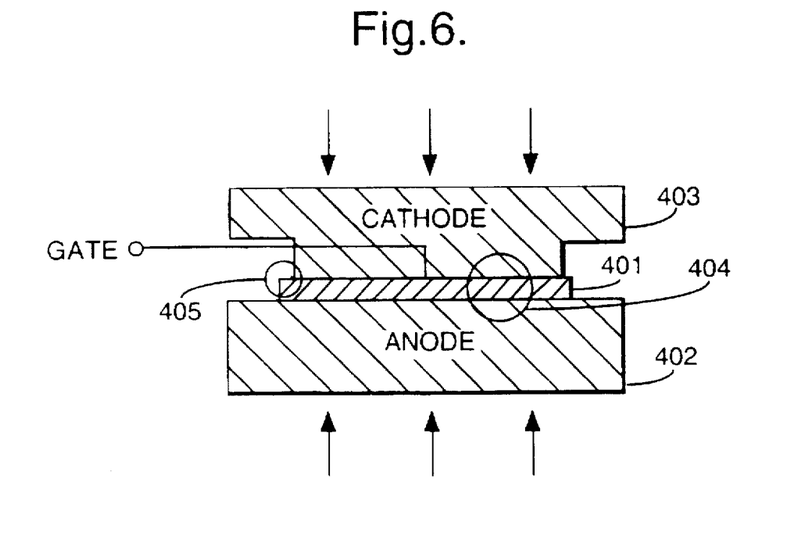
FIG. 6 is a sectional diagram of a pressure-packaged thyristor.

In FIG. 6, a pressure-packaged thyristor arrangement is illustrated comprising a basic thyristor unit 401 shown in cross-section with its three connections—anode, cathode and gate. The unit is a high-power device capable of blocking voltages of greater than 1200 V and conducting currents of greater than 200 A. The anode connection 402 and cathode connection 403 take the form of copper pole pieces which are subjected to an applied pressure (see arrows) against the basic unit 401. The pressure load is typically of the order of 15 MN/m². Also, in practice, the open parts of the thyristor arrangement are enclosed within a ceramic enclosure (not shown) providing both electrical isolation and hermetic sealing. Because pressure is applied in this arrangement from both sides of the thryristor unit, the arrangement is commonly known as a "double-sided pressure package".

This technique of pressure-packaging has two main advantages over other, conventional packaging techniques: firstly, it makes for a very low resistance between anode and cathode when the thyristor unit fails, and secondly, it tends to contain any internal debris released from a failure event within the package as a whole, thereby preventing damage to surrounding equipment. Most failures occur between the pole pieces 402, 403 (see, for example, area 404) and cause fusion of the pole pieces with the basic thyristor unit 401, thereby creating the desirable low resistance between anode and cathode. Where a failure occurs outside the contact area of the pole pieces (e.g. in an area 405), material is expelled, but it is rare for this to give rise to a pressure which causes the ceramic enclosure to rupture. Even when failure occurs in these outer regions of the thyristor unit, the fault almost invariably propagates between the pole pieces and creates the afore-mentioned low resistance.

Thanks to the pressure-packaging technique, and assuming the ASCR to be selected to withstand the short-circuit current without rupturing, the whole module will appear as a permanent short-circuit to the rest of the chain when the ASCR fails and will allow the chain to continue to function safely for as long as is necessary on the basis of its remaining modules. This will place somewhat greater stress on the remaining IGBT's; however, if these devices are rated to withstand the higher OFF-state voltages which now ensue, continued operation without the contribution of the IGBT's in the short-circuited module will be perfectly possible. This allows plenty of time for servicing personnel to shut down the plant, remove the offending module, repair, where appropriate, the fault that gave rise to the overvoltage condition in the first place and replace the "zapped" ASCR with a new device.

It is conceivable that the above-described process of turning on the ASCR could fail where the gate-switching path of the ASCR was somehow broken, e.g. by failure of the clipper 310 (zener 308 open-circuit) or of the passive circuitry linking the clipper with the ASCR (e.g. open-circuiting of the zener diode 207 or diode 208). In this situation, a fourth level of overvoltage protection is afforded, provided the ASCR 307 is selected so that its forward breakover voltage is less than the rated breakdown voltage of the IGBT's. Where this is the case, the ASCR simply breaks over by itself without any gate drive, the ASCR consequently going into failure mode, as occurs in the other protection levels, while protecting the IGBT's.

Note that the ASCR also provides protection in the event that the clipper fails not in the sense that it is unable to deliver an appropriate overvoltage sensing signal at its node 311, but in the sense that it delivers a spurious sensing signal, due for example to the resistor 309 going open-circuit. When this occurs, there is the possibility that the ASCR will turn on by gate-triggering action and go into short-circuit failure mode.

The four overvoltage protection levels described above apply not only to the situation where one or more of the IGBT's in a particular module do not receive an "ON" command, for whatever reason, but also to the situation where the IGBT's in a module are turned on, but one or more of them then receives a spurious "OFF" command.

In a fourth potential failure mode, it is assumed that the problem lies in the snubber 302, which ceases to function. This may be due to failure of either the diode 304, the resistor 305 or the capacitor 303. Under these circumstances, the dV/dt of the voltage across the IGBT's rises to a very high level (bearing in mind the fact that the IGBT's may well be operating at high frequency) and the result is that the ASCR 307 turns on by the well-known dV/dt action. (This is due to the presence of a Miller capacitance between the anode and gate of the ASCR which passes any fast-rising voltage on the anode onto the gate, thereby causing turn-on). Provided the dV/dt level at which turn-on of the ASCR occurs is less than that at which the IGBT's fail, the ASCR will again—as in the last case—go go irretrievably short-circuit due to the sharp increase in its anode current and the module will appear as a short-circuit to the rest of the chain, but the IGBT's will have been saved, as before.

In a fifth potential failure mode, the anti-parallel diode 301 is assumed to go open-circuit, for example due to rupture of its wire bonds. The ASCR then experiences an unrestrained reverse voltage which places it in its reverse breakdown mode. This fault condition again leads to an irreversible short-circuit in the ASCR, and the result is as before. Provided the ASCR fails at a lower reverse voltage than the IGBT's rated reverse voltage, the IGBT's will be protected from damage, although the ASCR will have been sacrificed. In practice, reverse breakdown ratings of 20V or so are easily achievable with any ASCR, and this is well within the corresponding maximum rating of an IGBT.

In a sixth possible failure mode, excessive current is caused to flow through the IGBT's in one arm of, say, the bridge arrangement of FIG. 1. This may be due to the application of a short-circuit to the load terminals, or due to the short-circuiting of the diagonally opposite arm in the bridge (e.g. on account of a crowbar action or electronic malfunction affecting the whole of that arm). The result is that the collector-emitter voltage of the IGBT's rises, these devices come out of saturation and excessive power dissipation may ensue.

Under these conditions, the desaturation protection and latching logic block 210 acts first of all to try to turn off all the IGBT's in the arm concerned, and does this in the following manner:

The presence of a desaturated "ON"-state voltage across the IGBT's is sensed at an input 213 of the desaturation protection and latching block 210. This input signal is fed to a window comparator 231 (see FIG. 5) comprising two comparators 232, 233. The IGBT voltage appearing on the input 213 is fed to the non-inverting inputs of both comparators, while reference potentials $Vref_1$ and $Vref_2$ are fed to the inverting inputs of comparators 233 and 232, respectively. $Vref_1$ is chosen such that, when the voltage on input 213 is in the IGBT's "desaturation" region, the output 234 of comparator 233 goes HIGH, and $Vref_2$ is chosen such that, when the voltage on input 213 is at a very high system voltage (as would be expected when the IGBT's are switched OFF), the output 235 of comparator 232 goes HIGH.

The outputs of the comparators 233, 232 are fed, firstly to the inputs of a two-input OR-gate 236, and secondly to the inputs 237, 238 of coincidence detectors 239 and 240, respectively. Second respective inputs 241, 242 of coincidence detectors 239 and 240 are fed in common from input 219 of the logic block 210. Input 219 also feeds a second input 243 of a further coincidence detector 244, the first input 245 of which is connected to an output of the OR-gate 236. The outputs of coincidence detectors 239 and 244 are taken to respective inputs 246, 247 of the trip/diagnostic encoder block 227.

When, now, the IGBT voltage is in its desaturation region while there is an "ON" signal state on input 219, both inputs 237, 241 of coincidence detector 239 are HIGH and detector 239 therefore outputs along a line 248 a signal to input 246 of the trip/diagnostic encode block 227. This block in turn provides a suitably encoded "TRIP" signal at an output 228, which signal is then output along the aforementioned optical-fibre link (not shown) via a line 214. The various "TRIP" signals which are output from all the modules in the arm concerned initiate turn-off of the complete arm by applying, in a co-ordinated manner, "OFF"-command signals to the inputs 218 of the various modules.

This is a first level of desaturation protection and is brought into action rapidly. Normally, all the modules in the arm will respond by turning off, however this is only possible where the gating circuitry to the IGBT's is functioning normally. Where this is not the case in any one particular module, or where for any other reason it is not possible to pull the IGBT's of a particular module out of a sustained desaturation condition, a second level of desaturation protection comes into play for that module, namely the firing of the ASCR crowbar. This occurs when the logic block 210 compares an "OFF" command (i.e. a "TRIP" command) on input 219 with the IGBT collector-emitter state on input 213 and discovers that the IGBT's in that module have not switched off. Under those circumstances, coincidence detector 240 sees a logic LOW state on its two inputs owing to, on the one hand, the "OFF" drive command on line 219 and, on the other hand, a logic LOW state on the output of comparator 232, which state would normally be HIGH in a turned-off state of the IGBT's. Coincidence detector 240 issues, therefore, along a line 249 a signal which, via output 215 of the logic block 210, serves to trigger the ASCR ON.

Output 215 is connected to the gate of the ASCR 307 via a diode 216 (see FIG. 3). The diode 216 serves to isolate the output 215 of block 210 from node 311 of the clipper 310, thereby allowing independent switching of the ASCR from either the clipper or the desaturation logic output.

One possible reason why an IGBT may not be able to be turned off is breakdown of the IGBT chip between collector and gate, so that a low impedance exists between these two points. Monitoring lines 222 are included in the drive and protection block 200 which connect the respective gates of the IGBT's to inputs of the desaturation protection and latching logic block 210. These inputs can be used to initiate the sending of an appropriate "DIAGNOSTICS" signal on the output line 214 warning service personnel of the presence of a collector-gate breakdown problem in the module concerned.

Another cause of desaturation in any particular module is the rupturing of one or more of the parallel-connected IGBT's, for example due to fusing of their wire bonds, or indeed by rupture of the chip itself. This results in an increase in the "ON" voltage across that module which, at the now larger operating currents being handled by the remaining IGBT's in the module, means a higher power dissipation in each of the remaining devices. Clearly, if this dissipation is too great, these remaining devices could easily fail as well. The desaturation protection and latching logic block 210 responds to this in the same way as for an overcurrent fault situation, as described above.

A further possible cause of desaturation is the presence of a weak drive signal on the gates of the IGBT's 101. Again, the response of the desaturation protection and latching logic block 210 is in this case exactly the same as for the other causes of desaturation.

The desaturation logic block 210 is also used to signal the presence of a failed ASCR to service personnel. Detection of an ASCR "clamped" (failed) condition is carried out in the coincidence detector 244 and is based on the simultaneous detection of an "OFF" state of the drive command signal on input 219 and a "saturation" state of the input 213. When the IGBTs are in saturation, both outputs 234, 235 of the window comparator 231 are logic LOW, so that the output of the OR-gate 236 is likewise LOW. Detector 244 now detects simultaneous LOW states on its inputs 243, 245 and sends an "ASCR-failed" signal to input 247 of the trip/diagnostic encode block 227. This block then outputs on line 214 a diagnostics signal which is encoded such as to alert service personnel to the fact that the ASCR in that module has gone into its irretrievable failure mode. This diagnostics signal can be made to operate an alarm signal (audible and/or visual) to alert the service personnel to the need to remove the offending module.

While the described embodiment has been based on the use of an ASCR in view of the earlier-listed benefits of this device, it is also possible to utilise a more conventional, symmetrical SCR in this position, including a GTO, though with reduced benefits (in particular, restrictions on the dV/dt-withstand capability and reverse-blocking capability).

The protection arrangement that has been described is suitable not only for IGBT's (both epitaxial and float-zone derivatives) but also for the following switching devices (whether wire-bonded, buried-gate, planar or mesa structures): GTO's (gate-turn-off thyristors), MCT's (MOS-controlled thyristors), FCT's (field-controlled thyristors), SIT's (static-induction thyristors), IGT's (insulated-gate thyristors).

A significant spin-off of the invention is that the ASCR used need not be a high-quality device—indeed, it can be a reject as far as most of its parameters are concerned. The main criterion for a suitable device is that it be able to withstand the normal (snubber-limited) dV/dt of the switching circuit in which it is being used. It is also an advantage if it has a reverse breakdown rating of less than 20V, but in practice this is easy to achieve, even in devices which are branded as rejects.

Since the ASCR is intended in this invention to fail when it functions in its protection mode, it should be placed in a position relative to the other components of the protection circuitry in which it can be readily changed by service personnel. It is advisable, therefore, to position the device on the outside of the module of which it forms a part.

I claim:

1. A switching arrangement comprising a switching device and a thyristor, said switching device having a pair of main current-carrying terminals and a direction of current flow for current flowing through said switching device during normal operation of said switching device, said thyristor having a pair of main current-carrying terminals and a direction of forward current flow through the thyristor, said pairs of main current-carrying terminals being connected in parallel such that said switching-device current-flow direction is the same as said thyristor forward current-flow direction, the arrangement being such that the thyristor fails when voltage conditions across the switching device become potentially damaging to said switching device, and presents an irreversible low impedance across said switching device.

2. A switching arrangement as claimed in claim 1, comprising a snubber means connected in parallel with the switching device, the thyristor being selected to be able to withstand the normal rate of change of voltage across the switching device in the presence of a functioning snubber means.

3. A switching arrangement as claimed in claim 2, comprising a clipper means connected in parallel with the thyristor.

4. A switching arrangement as claimed in claim 3, in which the clipper means comprises an overvoltage-sensing means for sensing the presence of an overvoltage condition across the switching device and providing a corresponding overvoltage control signal at an overvoltage control output, and a thyristor-triggering means connected to the overvoltage control output, the thyristor-triggering means serving to trigger the thyristor into conduction during said overvoltage condition.

5. A switching arrangement as claimed in claim 4, comprising a switching-device switching means connected between the overvoltage control output of the clipper means and a control terminal of the switching device, connections between the overvoltage control output and the thyristor-triggering means and between the overvoltage control output and the switching-device switching means being such as to prevent triggering of the thyristor when the switching device receives its normal turn-on signal during normal operation, and being such as to ensure that, under said overvoltage condition of the switching device, the switching device turns on in preference to the thyristor.

6. A switching arrangement as claimed in claim 5, in which the overvoltage-sensing means comprises an avalanche diode and a resistance connected in series across the switching device, the overvoltage control output being constituted by a junction of the avalanche diode and the resistance, and in which the thyristor-triggering means comprises a zener diode connected in series with a diode between the overvoltage control output and the gate of the thyristor, a breakdown voltage of the zener diode being greater than a voltage threshold beyond which the switching device is driven to an ON-state.

7. A switching arrangement as claimed in claim 1, in which the thyristor is an asymmetrical thyristor.

8. A switching arrangement as claimed in claim 8, in which the thyristor is a pressure-packaged asymmetrical thyristor.

9. A switching arrangement as claimed in claim 1, in which the switching device is an insulated-gate bipolar transistor.

10. A switching arrangement as claimed in claim 1, in which said thyristor is disposed with respect to its associated circuitry such that it can be easily changed when it has failed.

11. A high-voltage bridge arrangement for the connection of a load to a power source, in which each arm of the bridge comprises a switching arrangement comprising a switching device and a thyristor, said switching device having a pair of main current-carrying terminals and a direction of current flow for current flowing through said switching device during normal operation of said switching device, said thyristor having a pair of main current-carrying terminals and a direction of forward current flow through the thyristor, said pairs of main current-carrying terminals being connected in parallel such that said switching-device current-flow direction is the same as said thyristor forward current-flow direction, the arrangement being such that the thyristor fails when voltage conditions across the switching device become potentially damaging to said switching device, and presents an irreversible low impedance across said switching device.

12. In a switching arrangement comprising a switching device and a thyristor, said switching device having a pair of main current-carrying terminals and a direction of current flow for current flowing through said switching device during normal operation of said switching device, said thyristor having a pair of main current-carrying terminals and a direction of forward current flow through the thyristor, said pairs of main current-carrying terminals being connected in parallel such that said switching-device current-flow direction is the same as said thyristor forward current-flow direction, a method for the protection of said switching device against a damaging forward overvoltage, comprising the steps of:

(a) sensing the presence of an overvoltage across the main current-carrying terminals of the switching device;

(b) forming from step (a) an overvoltage control signal;

(c) attempting to switch the switching device into its on-state by means of the overvoltage control signal;

(d) where the attempt in step (c) fails, triggering the thyristor into its forward conductive state by means of the overvoltage control signal, and (e) allowing the thyristor to fail and to enter an irreversible low-impedance state, the voltage across the switching device being thereby clamped to a safe low level.

13. In a switching arrangement comprising a switching device and a thyristor, said switching device having a pair of main current-carrying terminals and a direction of current flow for current flowing through said switching device during normal operation of said switching device, said thyristor having a pair of main current-carrying terminals and a direction of forward current flow through the thyristor, said switching device and said thyristor having respective rated reverse breakdown voltages, said pairs of main current-carrying terminals being connected in parallel such that said switching-device current-flow direction is the same as said thyristor forward current-flow direction, a method for the protection of said switching device against a damaging reverse overvoltage, comprising the steps of:

(a) in the presence of a level of reverse voltage which is greater than the rated reverse breakdown voltage of the thyristor but less than that of the switching device, allowing the thyristor to enter its reverse breakdown mode, and (b) allowing the thyristor to fail and to enter an irreversible low-impedance state due to the reverse breakdown mode, the reverse voltage across the switching device being thereby clamped to a safe low level.

14. A method as claimed in claim 13, in which step (a) follows the failure of an antiparallel diode connected across the switching device to limit the reverse voltage across the switching device.

15. In a switching arrangement comprising a switching device and a thyristor, said switching device having a pair of main current-carrying terminals and a direction of current flow for current flowing through said switching device during normal operation of said switching device, said thyristor having a pair of main current-carrying terminals and a direction of forward current flow through the thyristor, said pairs of main current-carrying terminals being connected in parallel such that said switching-device current-flow direction is the same as said thyristor forward current-flow direction, a method for the protection of a switching device against a damaging rate of voltage increase (dV/dt), comprising the steps of:

(a) in the presence of a rate of voltage increase which is greater than a dV/dt turn-on rating of the thyristor but less than that which would damage the switching device, allowing the thyristor to turn on due to the excessive dV/dt;

(b) allowing the thyristor to experience a damaging rate of current increase or a damaging thermal overload, and (c) allowing the thyristor to fail and to enter an irreversible low-impedance state due to the damaging rate of current increase or thermal overload, the voltage across the switching device being thereby clamped to a safe low level.

16. A method as claimed in claim 15, in which step (a) follows the failure of a snubber arrangement connected across the switching device to limit the rate of voltage increase across the switching device.

* * * * *